United States Patent
Chen et al.

(10) Patent No.: US 11,398,583 B2
(45) Date of Patent: Jul. 26, 2022

(54) LIGHT-EMITTING DEVICE

(71) Applicant: EPISTAR CORPORATION, Hsinchu (TW)

(72) Inventors: Peng Ren Chen, Hsinchu (TW);
Yu-Shan Chiu, Hsinchu (TW);
Wen-Hsiang Lin, Hsinchu (TW);
Shih-Wei Wang, Hsinchu (TW); Chen Ou, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 17/010,480

(22) Filed: Sep. 2, 2020

(65) Prior Publication Data

US 2020/0403120 A1 Dec. 24, 2020

Related U.S. Application Data

(62) Division of application No. 16/397,775, filed on Apr. 29, 2019, now Pat. No. 10,784,404.

(30) Foreign Application Priority Data

Apr. 30, 2018 (TW) ................................. 107114617

(51) Int. Cl.
*H01L 33/22* (2010.01)
*H01L 33/00* (2010.01)
(Continued)

(52) U.S. Cl.
CPC ............ *H01L 33/22* (2013.01); *H01L 33/007* (2013.01); *H01L 33/025* (2013.01); *H01L 33/06* (2013.01); *H01L 33/12* (2013.01); *H01L 33/32* (2013.01)

(58) Field of Classification Search
CPC ..... H01L 33/007; H01L 33/025; H01L 33/06; H01L 33/12; H01L 33/22; H01L 33/32
(Continued)

(56) References Cited

U.S. PATENT DOCUMENTS

| 9,202,976 | B2 * | 12/2015 | Okuno | ............. | H01L 21/02502 |
| 2011/0012109 | A1 * | 1/2011 | Kryliouk | ........... | H01L 21/02433 |
| | | | | | 257/49 |

(Continued)

FOREIGN PATENT DOCUMENTS

| CN | 103811614 A | 5/2014 |
| JP | 2012079720 A | 4/2012 |

OTHER PUBLICATIONS

Office Action for related Chinese Patent Application No. 201910348458.9, dated Dec. 2, 2021, 13 pages.

*Primary Examiner* — Matthew E Warren
(74) *Attorney, Agent, or Firm* — Ditthavong, Steiner & Mlotkowski

(57) ABSTRACT

A light-emitting device, includes a substrate structure, including a base portion having a surface and a plurality of protrusions regularly formed on the base portion; a buffer layer covering the plurality of protrusions and the surface; and III-V compound semiconductor layers formed on the buffer layer; wherein one of the plurality of protrusions includes a first portion and a second portion formed on the first portion and the first portion is integrated with the base portion; and wherein the base portion includes a first material and the first portion includes the first material.

14 Claims, 5 Drawing Sheets

(51) Int. Cl.
  *H01L 33/32* (2010.01)
  *H01L 33/12* (2010.01)
  *H01L 33/06* (2010.01)
  *H01L 33/02* (2010.01)
(58) Field of Classification Search
  USPC .................................................. 257/94–98
  See application file for complete search history.

(56) References Cited

U.S. PATENT DOCUMENTS

2014/0209857 A1   7/2014  Takano et al.
2015/0041823 A1*  2/2015  Chiu ....................... H01L 33/32
                                                      257/76
2016/0064606 A1*  3/2016  Chiu ....................... H01L 33/22
                                                      257/76
2018/0047871 A1*  2/2018  Jung ....................... H01L 33/06

\* cited by examiner

100

LIGHT-EMITTING DEVICE

CROSS-REFERENCE TO RELATED APPLICATIONS

This application is a divisional application of U.S. patent application Ser. No. 16/397,775, filed on Apr. 29, 2019, which claims priority to the benefit of Taiwan Application Serial Number 107114617 filed on Apr. 30, 2018, and the entire contents of which are hereby incorporated by reference herein in its entirety.

BACKGROUND

Technical Field

The present disclosure relates to a light-emitting device, more specifically, to a light-emitting device including a substrate structure.

Description of the Related Art

The light-emitting diodes (LEDs) have been widely used in solid-state lighting. The LEDs have the characteristics of low power consumption and long life time compared with conventional incandescent lamp and fluorescent lamp. Therefore, the LEDs have gradually replaced conventional light source and are applied to various fields, such as traffic lamps, backlight modules, streetlights, medical equipment and the like.

SUMMARY

A light-emitting device, includes a substrate structure, including a base portion having a surface and a plurality of protrusions regularly formed on the base portion; a buffer layer covering the plurality of protrusions and the surface; and III-V compound semiconductor layers formed on the buffer layer; wherein one of the plurality of protrusions includes a first portion and a second portion formed on the first portion and the first portion is integrated with the base portion; and wherein the base portion includes a first material and the first portion includes the first material.

A method of manufacturing a light-emitting device, including: providing a substrate structure including a base portion and wherein the base portion includes a surface; performing a patterning step to form a plurality of protrusions, wherein the plurality of protrusions are arranged on the surface of the base portion; forming a buffer layer on the surface of the base portion by physical vapor deposition, wherein the buffer layer covers the protrusions; and forming III-V compound semiconductor layers on the buffer layer; wherein one of the plurality of protrusions has a height not greater than 1.5 µm; and wherein the light-emitting device has a full width at half maximum (FWHM) of smaller than 250 arcsec in accordance with a (102) XRD rocking curve.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

Figure 1A:
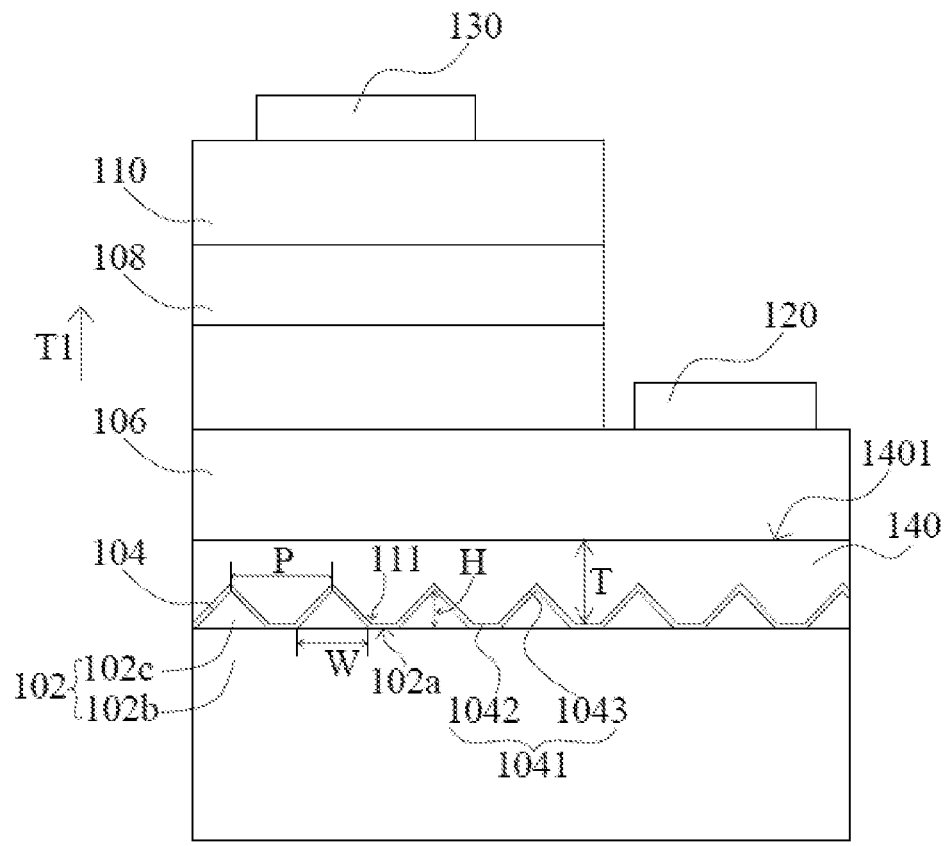
FIGS. 1A and 1B show a light-emitting device in accordance with a first embodiment of the present application.
Figure 1B:
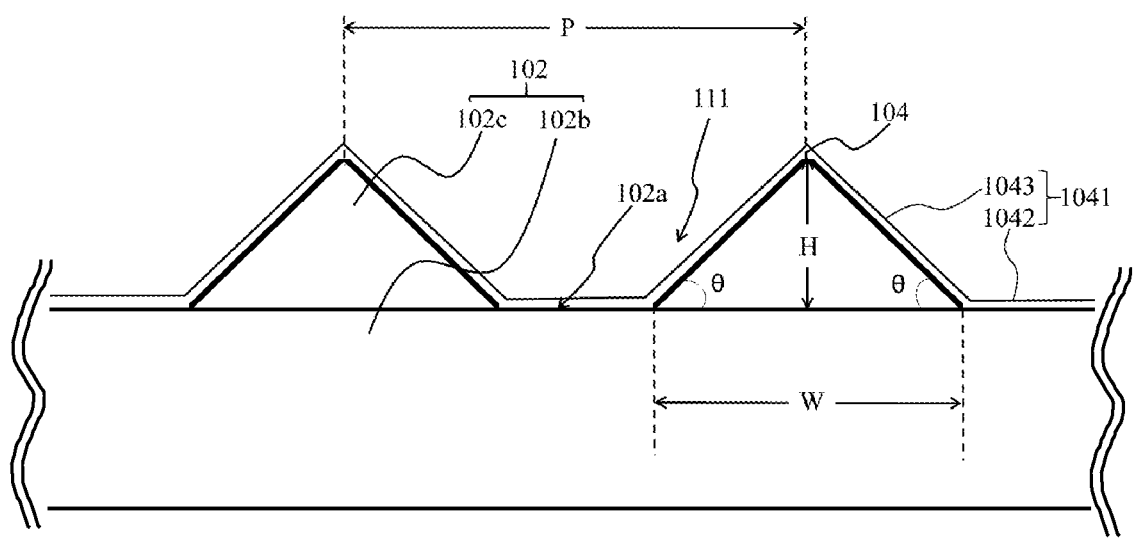

FIGS. 1A and 1B show a light-emitting device 100 in accordance with a first embodiment of the present application. FIG. 1A shows a cross-sectional view of the light-emitting device 100. As shown in FIG. 1A, the light-emitting device 100 includes a substrate structure 102, a buffer layer 104 formed on the substrate structure 102, a first semiconductor layer 106 formed on the buffer layer 104, a light-emitting structure 108 formed on the first semiconductor layer 106 and a second semiconductor layer 110 formed on the light emitting structure 108. The first semiconductor layer 106, the light emitting structure 108 and the second semiconductor layer 110 include III-V compound semiconductor, such as aluminum gallium indium nitride ($In_xAl_yGa_{1-x-y}N$, $0 \le x \le 1$, $0 \le y \le 1$). The light-emitting structure 108 can be a single heterostructure (SH), a double heterostructure (DH), a double-side double heterostructure (DDH), or a multi-quantum well, MQW). As shown in FIG. 1A, a direction T1 indicates the growth direction of the light-emitting structure 108. The light-emitting structure 108 generates radiation. In this embodiment, the radiation includes light. The light can be visible or invisible. The light has a dominant wavelength which can be between 250 nm and 500 nm. In this embodiment, the light-emitting device 100 further includes a first electrode 120 and a second electrode 130. The first electrode 120 is formed on the first semiconductor layer 106 and electrically connects to the first semiconductor layer 106. The second electrode 130 is formed on the second semiconductor layer 106 and electrically connects to the second semiconductor layer 106.

Referring to FIG. 1B and FIG. 1A, FIG. 1B is a partial enlarged view of the substrate structure 102 of FIG. 1A. The substrate structure 102 includes a base portion 102b and a plurality of protrusions 102c. The base portion 102b has a surface 102a. In one embodiment, the thickness of the base portion 102b is not less than 100 µm. In one embodiment, the thickness of the base portion 102b is not more than 300 µm. The plurality of protrusions 102c is arranged in a two-dimensional array on the surface 102a of the base portion 102b, and the arrangement of the plurality of protrusions 102c can be regular or irregular. Each of the protrusions 102c includes a first material and the base portion 102b includes a second material. The refractive index of the first material is smaller than the refractive index of the second material. Specifically, the refractive index of the first material of the protrusion 102c at the dominant wavelength is smaller than the refractive index of the second material of the base portion 102b at the dominant wavelength. In one embodiment, at the dominant wavelength, the difference between the refractive index of the first material of the protrusion 102c and the refractive index of the second material of the base portion 102b is greater than 0.1; in another embodiment, the difference is greater than 0.15; and still in another embodiment, the difference is between 0.15 and 0.4 (both inclusive). The material of the base portion 102b can be sapphire, and the surface 102a is c-plane which is suitable for epitaxial growth. The material of each of the protrusions 102c can be silicon dioxide ($SiO_2$). The three-dimensional shape of the protrusion 102c includes a dome, a cone, or a pyramid. The cone includes a truncated cone and the pyramid includes a polygonal pyramid or a truncated pyramid. In the embodiment, the three-dimensional shape of the protrusion 102c is a cone, wherein the protrusion 102c is substantially triangular in the cross-sectional view of the light-emitting device. The buffer layer 104 is conformally formed on the plurality of protrusion 102c and the surface 102a. Specifically, the buffer layer 104 has a top surface 1041 opposite to the base portion 102b. The top surface 1041 includes a first portion 1042 and a second portion 1043 connected to the first portion 1042. The first portion 1042 covers the surface 102a. The second portion 1043 covers the plurality of protrusions 102c. In the cross-sectional view of the light-emitting device 100, a recess 111 is defined between the first portion 1042 and the second portion 1043. In one embodiment, the buffer layer 104 comprises aluminum nitride (AlN). In one embodiment, the thickness of the buffer layer 104 is greater than 5 nm; in another embodiment, the thickness is not more than 50 nm; and still in another embodiment, the thickness is between 10 nm and 30 nm (both inclusive). If the thickness of the buffer layer 104 is less than 5 nm, the defect density of the epitaxial layers (e.g. the first semiconductor layer 106) subsequently grown thereon becomes high and the epitaxial quality of the light-emitting device is disrupted. If the thickness of the buffer layer 104 is more than 50 nm, for example, an AlN buffer layer with a thickness of more than 50 nm, the dominant wavelengths of the plurality of light-emitting devices epitaxially grown on the same wafer are inconsistent with each other. As shown in FIG. 1B, an included angle θ is between the surface 102a and the side surface of one protrusion 102c or each of the protrusions 102c. In one embodiment, θ is not greater than 65 degrees; in another embodiment, θ is not more than 55 degrees; and still in another embodiment, θ is between 30 and 65 degrees (both inclusive). In one embodiment, two included angles θ are between the surface 102a and the side surface of one protrusion 102c or each of the protrusions 102c and θ are not greater than 65 degrees; in another embodiment, θ are not greater than 55 degrees; and still in another embodiment, θ are between 30 and 55 degrees (both inclusive). In one embodiment, the two included angles θ of one protrusion 102c or the two included angles θ of each protrusion 102c have the same degrees or different degrees. Each protrusion 102c has a height H and a bottom width W. In the present embodiment, the height H is not more than 1.5 and in another embodiment, the height H is between 0.5 μm and 1.5 μm (both inclusive). The bottom width W is not less than 1 μm, and in another embodiment, the bottom width W is between 1 μm and 3 μm (both inclusive). In one embodiment, the ratio of the height H to the bottom width W is greater than 0 and not more than 0.5. In another embodiment, the ratio of the height H to the bottom width W is between 0.4 and 0.5 (both inclusive). As shown in the figures, the arrangement of the protrusions 102c has a period P. In one embodiment, the protrusion 102c has a vertex, and the vertex is the part of the protrusion 102c which is closest to the light-emitting structure 108 along the direction T1. The period P is defined as the distance between the vertices of two adjacent protrusions 102c. In this embodiment, the cross-section of the protrusion 102c is substantially triangular, and the period P is between 1 μm and 3 μm (both inclusive). In one embodiment, the height H=1.2 μm±10%; the bottom width W=2.6 μm±10%; the period P=3.0 μm±10%. In another embodiment, the height H=0.9 μm±10%; the width W=1.6 μm±10%; the period P=1.8 μm±10%. In another embodiment, H=1 μm±10%; W=1.5 μm 10%; P=1.8 μm±10%. In another embodiment, the height H=1.2 μm±10%, the width W=2.6 μm±10%; and the period P=3.0 μm±10%. In one embodiment, x-ray diffraction (XRD) analysis is used to investigate the material characteristics of the epitaxy layers of the light-emitting device 100. The light-emitting device 100 has a FWHM (full width at half maximum) value of smaller than 250 arcsec in accordance with a (102) XRD rocking curve. In one embodiment, the FWHM value is not smaller than 100 arcsec. Light emitted from the light-emitting structure 108 is reflected and/or refracted due to the plurality of protrusions 102c formed on the surface 102a of the substrate structure 102 so that the light emitting efficiency of the light-emitting device 100 is improved. Moreover, in this embodiment, because of the substrate structure 102 coupled with the buffer layer 104, the quality of the semiconductor layers and the light-emitting structure 108 grown thereon is improved.

As shown in FIG. 1A, a method for fabricating a light-emitting device 100 in accordance with an embodiment of the present application includes: providing a substrate structure 202 including the base portion 202b and the plurality of protrusions 202c formed thereon, wherein the base portion 202b has a surface 202a; and performing a patterning step to form the plurality of protrusions 202c. The patterning step includes forming a precursor layer (not shown) on the surface 102a by, for example, physical vapor deposition (PVD), and then removing a portion of the precursor layer. The method of removing the portion of the precursor layer includes dry etching or wet etching. The portion of the precursor layer is removed and then the other portion of the precursor layer kept on the surface 202a forms the plurality of protrusions 202c separated from each other. In the embodiment, the protrusion is substantially triangular in the cross-sectional view. The plurality of protrusions 202c is arranged in a two-dimensional array on the surface 202a of the base portion 202b, and the arrangement of the plurality of protrusions 202c can be regular or irregular. The method for fabricating the light-emitting device 100 in accordance with an embodiment of the present application further includes forming the buffer layer 104 on the surface 102a of the base portion 202b and covering the protrusions 202c. The buffer layer 204 comprises aluminum nitride (AlN). The method of forming a buffer layer 104 includes physical vapor deposition (PVD). The method of fabricating the light-emitting device 100 further includes forming the first semiconductor layer 206, the light-emitting structure 208 and the second semiconductor layer 210 by epitaxial growth such as metal organic chemical vapor deposition (MOCVD). The method of epitaxial growth includes, but is not limited to, MOCVD, hydride vapor phase epitaxial (HVPE), or liquid-phase epitaxy (LPE).

As shown in the embodiment of FIG. 1A, the light-emitting device 100 further includes a cap layer 140 between the buffer layer 104 and the first semiconductor layer 106. The cap layer 140 has a thickness T that is greater than the thickness of the buffer layer 104. The cap layer 140 comprises III-V compound semiconductor having an energy gap smaller than that of the material of the buffer layer 104. In an embodiment, the cap layer 140 comprises gallium nitride (GaN). Specifically, the cap layer 140 covers the buffer layer 104, and a portion of the cap layer 140 is located in the recess 111. The cap layer 140 includes a top surface 1401 opposite to the buffer layer 104, and the thickness T of the cap layer 140 refers to the shortest distance between the first portion 1042 of the top surface 1041 and the top surface 1401. In one embodiment, the cap layer 140 has a thickness T greater than 1 μm; in another embodiment, T is not more than 3.5 μm; and still in another embodiment, T is between 1 μm and 2 μm. In an embodiment, the cap layer 140 does not include dopants that are intentionally doped. Specifically, the doping concentration of the cap layer 140 is not more than $5 \times 10^{17}/cm^3$, and in one embodiment, not more than $1 \times 10^{17}/cm^3$. In this embodiment, since the plurality of protrusions 102c is formed on the surface 102a of the substrate structure 102 and the height of the protrusions 102c is not more than 1.5 μm, the cap layer 140 of the light-emitting device 100 is thinner than that of the conventional light-emitting device, yet the light-emitting device 100 has the same performance as the conventional light-emitting device. Therefore, the light-emitting device 100 in the embodiment has an advantage of being small in size.

Figure 2A:
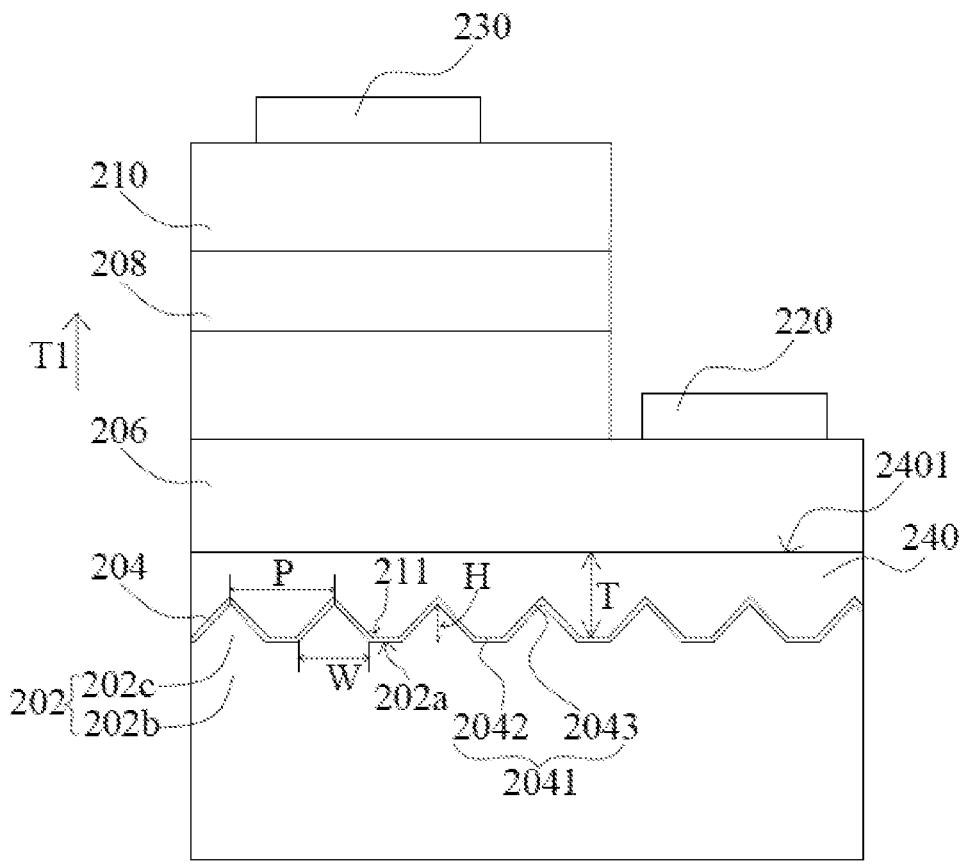
FIGS. 2A and 2B show a light-emitting device in accordance with a second embodiment of the present application.
Figure 2B:
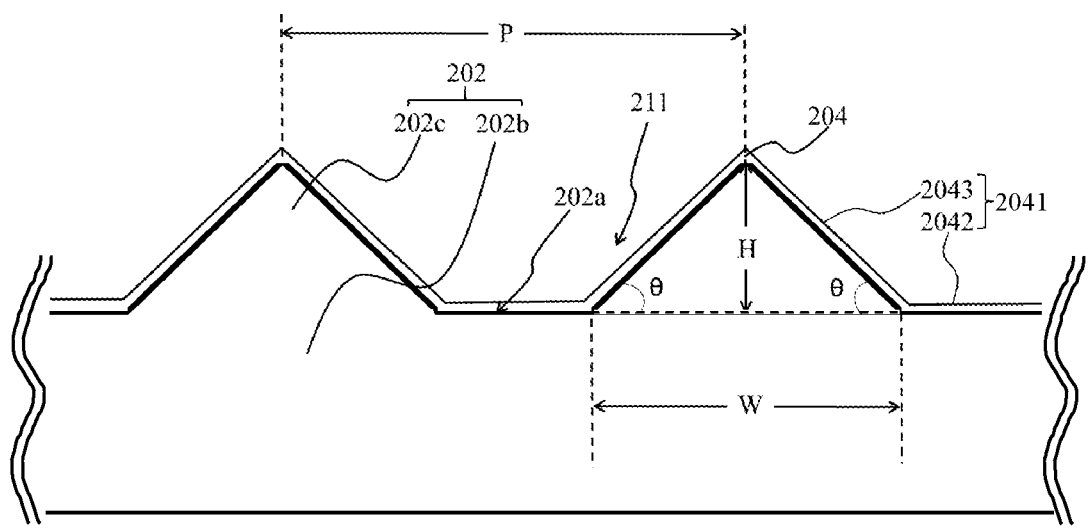

FIGS. 2A and 2B show a light-emitting device 200 in accordance with another embodiment of the present application. As shown in FIG. 2A, the light-emitting device 200 includes a substrate structure 202, a buffer layer 204 formed on the substrate structure 202, a cap layer 240 formed on the buffer layer 201, a first semiconductor layer 206 formed on the cap layer 240, a light emitting structure 208 formed on the first semiconductor layer 206 and a second semiconductor layer 210 formed on the light emitting structure 208. The first semiconductor layer 206, the light emitting structure 208 and the second semiconductor layer 210 include III-V compound semiconductor, such as aluminum gallium indium nitride ($In_xAl_yGa_{1-x-y}N$, $0 \leq x \leq 1$, $0 \leq y \leq 1$). The light emitting structure 208 includes a single heterostructure (SH), a double heterostructure (DH), a double-side double heterostructure (DDH), or a multi-quantum well structure, MQW). As shown in FIG. 2A, the direction T1 indicates the growth direction of the light emitting structure 208. The light emitting structure 208 generates radiation. In this embodiment, the radiation includes light. The light can be visible or invisible. The light has a dominant wavelength between 250 nm and 500 nm. In this embodiment, the light-emitting device 200 includes a first electrode 220 and a second electrode 230. The first electrode 220 is formed on the first semiconductor layer 206 and electrically connects to the first semiconductor layer 206. The second electrode 230 is formed on the second semiconductor layer 206 and electrically connects to the second semiconductor layer 206.

Referring to FIG. 2B and FIG. 2A, FIG. 2B is a partially enlarged view of the substrate structure 202 of FIG. 2A. The substrate structure 202 includes a base portion 202b and a plurality of protrusions 202c. The base portion 202b has a surface 202a. In one embodiment, the thickness of the base portion 202b is not less than 100 μm; in another embodiment, the thickness of the base portion 202b is not more than 300 μm. The plurality of protrusions 202c is arranged in a two-dimensional array on the surface 202a of the base portion 202b, and the arrangement of the plurality of protrusions 202c can be regular or irregular. In the embodiment, each protrusion 202c is integrated with the base portion 202b. Specifically, each protrusion 202c and the base portion 202b have the same material such as sapphire, and the surface 202a is c-plane which is suitable for epitaxial growth. The three-dimensional shape of the protrusion 202c includes a dome, a cone, or a pyramid. The cone includes a truncated cone and the pyramid includes a polygonal pyramid or a truncated pyramid. In the embodiment, the three-dimensional shape of the protrusion 202c is a cone and the protrusion 202c is substantially triangular in the cross-sectional view of the light-emitting device. The buffer layer 204 is conformally formed on the plurality of protrusion 202c and the surface 202a. Specifically, the buffer layer 204 has a top surface 2041 opposite to the base portion 202b. The top surface 2041 includes a first portion 2042 and a second portion 2043 connected to the first portion 2042. The first portion 2042 covers the surface 202a. The second portion 2043 covers the plurality of protrusions 202c. In the cross-sectional view of the light-emitting device, a recess 211 is formed between the first portion 2042 and the second portion 2043. In one embodiment, the buffer layer 204 comprises aluminum nitride (AlN). The thickness of the buffer layer 204 is greater than 5 nm; in another embodiment, the thickness of the buffer layer 204 is not more than 50 nm; and still in another embodiment, the thickness of the buffer layer 204 is between 10 nm and 30 nm (both inclusive). If the thickness of the buffer layer 204 is less than 5 nm, the defect density of the epitaxial layers subsequently grown thereon (e.g. the first semiconductor layer 206) becomes high and the epitaxial quality of the light-emitting device is disrupted. If the thickness of the buffer layer 104 is more than 50 nm, for example, an AlN buffer layer with a thickness of more than 50 nm, the dominant wavelengths of the plurality of light-emitting devices epitaxially grown on the same wafer are inconsistent with each other. As shown in FIG. 2B, an included angle θ is between the surface 202a and the side surface of one protrusion 202c or each of the protrusions 102c. In one embodiment, θ is not greater than 65 degrees; in another embodiment, θ is not more than 55 degrees; and still in another embodiment, θ is between 30 and 65 degrees (both inclusive). In one embodiment, two included angles θ are between the surface 202a and the side surface of one protrusion 202c or each of the protrusions 202c and θ are not greater than 65 degrees. In one embodiment, θ are not greater than 55 degrees. In another embodiment, θ are between 30 and 55 degrees (both inclusive). In one embodiment, the two included angles θ of one protrusion 202c or the two included angles θ of each protrusion 202c have the same degrees or different degrees. Each protrusion 202c has a height H and a bottom width W. In the present embodiment, the height H is not more than 1.5 μm. In another embodiment, the height H is between 0.5 μm and 1.5 μm (both inclusive). The bottom width W is not less than 1 and in another embodiment, the bottom width W is between 1 μm and 3 μm (both inclusive). In one embodiment, the ratio of the height H to the bottom width W is greater than 0 and not more than 0.5. In another embodiment, the ratio of the height H to the bottom width W is between 0.4 and 0.5 (both inclusive). As shown in the figures, the arrangement of the protrusions 202c has a period P. In one embodiment, the protrusion 202c has a vertex, and the vertex is the part of the protrusion 202c which is closest to the light-emitting structure 208 along the direction T1. The period P is defined as the distance between the vertices of two adjacent protrusions 202c. In this embodiment, the cross-section of the protrusion 202c is substantially triangular, and the period P is between 1 μm and 3 μm (both inclusive). In one embodiment, the height H=1.2 μm±10%; the bottom width W=2.6 μm±10%; the period P=3.0 μm±10%. In another embodiment, the height H=0.9 μm±10%; the width W=1.6 μm±10%; the period P=1.8 μm±10%. In another embodiment, H=1 μm±10%; W=1.5 μm 10%; P=1.8 μm±10%. In another embodiment, the height H=1.2 μm±10%, the width W=2.6 μm±10%; and the period P=3.0 µm±10%. In one embodiment, XRD analysis is used to investigate the material characteristics of the epitaxy layers of the light-emitting device 200. The light-emitting device 200 has a FWHM value of smaller than 250 arcsec in accordance with a (102) XRD rocking curve. In one embodiment, the FWHM value is not smaller than 100 arcsec. Light emitted from the light-emitting structure 208 is reflected and/or refracted due to the plurality of protrusions 202*c* formed on the surface 202*a* of the substrate structure 202 so that the light emitting efficiency of the light-emitting device 200 is improved. Moreover, because of the substrate structure 202 coupled with the buffer layer 204 in accordance with the present embodiment, the quality of the semiconductor layers and the light-emitting structure 208 grown thereon is improved.

As shown in FIG. 2A, a method for fabricating a light-emitting device 200 in accordance with an embodiment of the present application includes: providing a substrate structure 202 including the base portion 202*b* and the plurality of protrusions 202*c* formed thereon, wherein the base portion 202*b* has a surface 202*a*. The plurality of protrusions 202*c* is arranged in a two-dimensional array on the surface 202*a* of the base portion 202*b*, and the arrangement of the plurality of protrusions 202*c* can be regular or irregular. A buffer layer 204 is formed on the surface 202*a* of the base portion 202*b* and covers the protrusions 202*c*. The buffer layer 204 comprises aluminum nitride (AlN). In one embodiment, the method of fabricating the substrate structure 202 includes providing a substrate (not shown) having a top surface and then performing a patterning step including removing a portion of the substrate from the top surface of the substrate to form the base portion 202*b* and the plurality of protrusions 202*c* spaced apart with each other on the base portion 202*b*. The base portion 202*b* has the surface 202*a*. The method of removing the portion of substrate includes dry etching or wet etching. In this embodiment, the protrusion 202*c* is substantially triangular in the cross-sectional view of the light-emitting device 200. A method of forming a buffer layer 204 includes physical vapor deposition (PVD). The method of fabricating the light-emitting device 200 includes forming the first semiconductor layer 206, the light-emitting structure 208, and the second semiconductor layer 210 by metal organic chemical vapor deposition (MOCVD). The method of performing epitaxial growth includes, but is not limited to, MOCVD, hydride vapor phase epitaxial (HVPE), or liquid-phase epitaxy (LPE).

As shown in FIG. 2A, in the present embodiment, the light-emitting device 200 further includes a cap layer 240 between the buffer layer 204 and the first semiconductor layer 206. The cap layer 240 has a thickness T that is greater than the thickness of the buffer layer 204. The cap layer 240 comprises III-V compound semiconductor having an energy gap smaller than that of the material of the buffer layer 204. In an embodiment, the cap layer 240 includes gallium nitride (GaN). Specifically, the cap layer 240 covers the buffer layer 204, and a portion of the cap layer 240 is located in the recess 211. The cap layer 240 includes a top surface 2401 opposite to the buffer layer 204, and the thickness T of the cap layer 240 refers to the shortest distance between the first portion 2042 and the top surface 2401. In one embodiment, the thickness T of the cap layer 240 is greater than 1 µm. In one embodiment, the thickness T of the cap layer 240 is not greater than 3.5 µm. In one embodiment, the thickness T of the cap layer 240 ranges from 1 µm to 2 µm. In one embodiment, the cap layer 240 includes impurities that are not intentionally doped. Specifically, the impurity concentration of the cap layer 140 is not more than $5 \times 10^{17}/cm^3$. In another embodiment, the impurity concentration of the cap layer 140 not more than $1 \times 10^{17}/cm^3$. In this embodiment, since the plurality of protrusions 202*c* is formed on the surface 202*a* of the substrate structure 202 and the height of the protrusions 202*c* is not more than 1.5 µm, the cap layer 240 of the light-emitting device 200 is thinner than that of the conventional light-emitting device, yet the light-emitting device 200 has the same performance as the conventional light-emitting device. Therefore, the light-emitting device 200 in the embodiment has an advantage of being small in size.

Figure 3A:
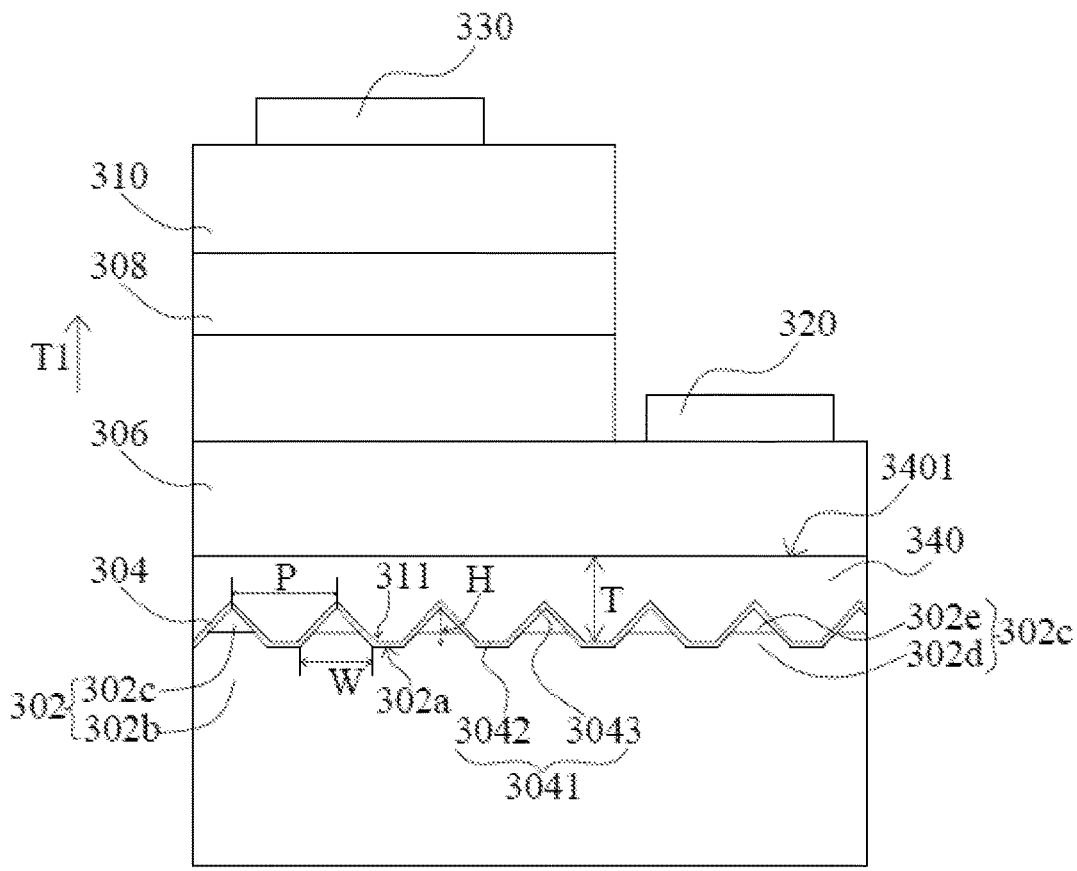
FIGS. 3A and 3B show a light-emitting device in accordance with a third embodiment of the present application.
Figure 3B:
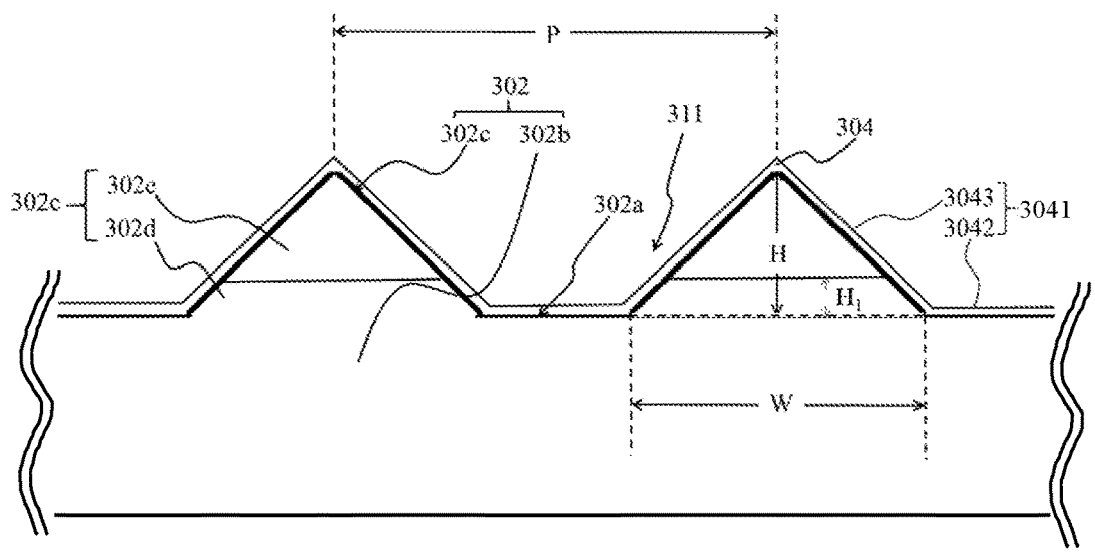

FIGS. 3A and 3B show another embodiment of a light-emitting device 300 of the present application. As shown in FIG. 3A, the light-emitting device 300 includes a substrate structure 302, a buffer layer 304 formed on the substrate structure 302, a first semiconductor layer 306 formed on the buffer layer 304, a light emitting structure 308 formed on the first semiconductor layer 306 and a second semiconductor layer 310 formed on the light emitting structure 308. The first semiconductor layer 306, the light emitting structure 308, and the second semiconductor layer 310 include III-V compound semiconductor, such as aluminum gallium indium nitride ($In_xAl_yGa_{1-x-y}N$, 0≤x≤1, 0≤y≤1). The light emitting structure 308 includes a single heterostructure (SH), a double heterostructure (DH), a double-side double heterostructure (DDH), or a multi-quantum well structure, MQW). As shown in FIG. 3A, the direction T1 indicates the growth direction of the light emitting structure 308. The light emitting structure 308 generates radiation. In this embodiment, the radiation includes light. The light can be visible or invisible. The light has a dominant wavelength between 250 nm and 500 nm. The light-emitting device 300 further includes a first electrode 320 and a second electrode 330. The first electrode 320 is formed on the first semiconductor layer 306 and electrically connects to the first semiconductor layer 306. The second electrode 330 is formed on the second semiconductor layer 306 and electrically connects to the second semiconductor layer 306.

Referring to FIG. 3B and FIG. 3A, FIG. 3B is a partially enlarged view of the substrate structure 302 of FIG. 3A. The base portion 302*b* has a surface 302*a*. In one embodiment, the thickness of the base portion 302*b* is not less than 100 µm. In another embodiment, the thickness of the base portion 302*b* is not more than 300 µm. The plurality of protrusions 302*c* is arranged in a two-dimensional array on the surface 302*a* of the base portion 302*b*, and the arrangement of the plurality of protrusions 302*c* can be regular or irregular. Each protrusion 302*c* includes a first portion 302*d* and a second portion 302*e* on the first portion 302*d*. The first portion 302*d* is integrated with the base portion 302*b* and the second portion 302*e* is formed on the first portion 302*d*. Specifically, the first portion 302*d* includes a first material that is the same as the material of the base portion 302*b*. The second portion 302*e* includes a second material that is different from the first material. In the embodiment, the refractive index of the second material is smaller than the refractive index of the first material. Specifically, the refractive index of the second material of the second portion 302*e* at the dominant wavelength is smaller than the refractive index of the first material of the first portion 302*d* at the dominant wavelength. In one embodiment, in terms of the dominant wavelength, the difference between the refractive index of the second material of the second portion 302*e* and the refractive index of the first material of the first portion 302*d* is greater than 0.1; in another embodiment, the difference is greater than 0.15; and still in another embodiment, the difference is between 0.15 and 0.4 (both inclusive). The three-dimensional shape of the protrusion 302c includes a dome, a cone, or a pyramid. The cone includes a truncated cone and the pyramid includes a polygonal pyramid or a truncated pyramid. In the embodiment, the three-dimensional shape of the protrusion 302c is a cone and the protrusion 302c is substantially triangular in the cross-sectional view. The material of the second portion 302e can be silicon dioxide ($SiO_2$). The material of the first portion 302d and the base portion 302b can be sapphire, and the surface 302a is c-plane which is suitable for epitaxial growth. The buffer layer 304 is conformally formed on the plurality of protrusion 302c and the surface 302a. In one embodiment, the buffer layer 304 comprises aluminum nitride (AlN). In one embodiment, the thickness of the buffer layer 304 is greater than 5 nm; in another embodiment, the thickness is not more than 50 nm; and still in another embodiment, the thickness is between 10 nm and 30 nm (both inclusive). If the thickness of the buffer layer 304 is less than 5 nm, the defect density of the epitaxial layers (e.g. the first semiconductor layer 306) subsequently grown thereon becomes high and the epitaxial quality of the light-emitting device is disrupted. If the thickness of the buffer layer 304 is more than 50 nm, for example, an AlN buffer layer with a thickness of more than 50 nm, the dominant wavelengths of the plurality of light-emitting devices epitaxially grown on the same wafer are inconsistent with each other. As shown in FIG. 3B, an included angle θ is between the surface 302a and the side surface of one protrusion 302c or each of the protrusions 302c. In one embodiment, θ is not greater than 65 degrees; in another embodiment, θ is not more than 55 degrees; and still in another embodiment, θ is between 30 and 65 degrees (both inclusive). In one embodiment, two included angles θ are between the surface 302a and the side surface of one protrusion 302c or each protrusion 302c and θ are not greater than 65 degrees; in another embodiment, θ are not greater than 55 degrees; and still in another embodiment, θ are between 30 and 55 degrees (both inclusive). In one embodiment, the two included angles θ of one protrusion 302c or the two included angles θ of each protrusion 302c have the same degrees or different degrees. Each of the protrusions 302c has a height H and a bottom width W. In one embodiment, the ratio of the height H to the bottom width W is greater than 0 and not more than 0.5. In one embodiment, the ratio of the height (H1) of the first portion 302d of one or of each protrusions 302c to the height (H) of the protrusion 302c ranges between 1% and 30% (both inclusive). In another embodiment, the ratio of the height (H1) of the first portion 302d of one or of each protrusion 302c to the height (H) of the protrusion 302c ranges between 10% and 30% (both inclusive). As shown in the figures, the arrangement of the protrusions 302c has a period P. In one embodiment, the protrusion 302c has a vertex, and the vertex is the part of the protrusion 302c which is closest to the light emitting structure 308 along the direction T1. The period P is defined as the distance between the vertices of two adjacent protrusions 302c. In this embodiment, the cross-section of the protrusion 302c is substantially triangular, and the period P is between 1 μm and 3 μm (both inclusive). In one embodiment, the height H=1.2 μm±10%; the bottom width W=2.6 μm±10%; the period P=3.0 μm±10%. In another embodiment, the height H=0.9 μm±10%; the width W=1.6 μm±10%; the period P=1.8 μm±10%. In another embodiment, H=1 μm±10%; W=1.5 μm±10%; P=1.8 μm 10%. In another embodiment, the height H=1.2 μm±10%, the width W=2.6 μm±10%; and the period P=3.0 μm±10%. In one embodiment, XRD analysis is used to investigate the material characteristics of the epitaxy layers of the light-emitting device 300. The light-emitting device 300 has a FWHM value of smaller than 250 arcsec in accordance with a (102) XRD rocking curve. In one embodiment, the FWHM is not smaller than 100 arcsec.

As shown in FIG. 3A, a method for fabricating a light-emitting device 300 in accordance with an embodiment of the present application includes: providing a substrate structure 302 including the base portion 302b and the plurality of protrusions 302c formed thereon, which includes providing a substrate (not shown) having a top surface (not shown), and then performing a patterning step to form the base portion 302b and the plurality of protrusions 302c space apart from each other on the base portion 302b. The patterning step includes forming a precursor layer (not shown) on the top surface of the substrate by, for example, physical vapor deposition (PVD), and then removing a portion of the precursor layer and a portion of the substrate from the top surface. The method of removing the portion of the precursor layer and the portion of the substrate includes dry etching or wet etching. The portion of the precursor layer and the portion of the substrate are removed to form the based portion 302b with the surface 302a and the other portions of the precursor layer and the substrate kept on base portion 302b form the plurality of protrusions 302c separated from each other. In the embodiment, the protrusion is substantially triangular in a cross-sectional view. The plurality of protrusions 302c is arranged in a two-dimensional array on the surface 302a of the base portion 302b, and the arrangement of the plurality of protrusions 302c can be regular or irregular. The method for fabricating the light-emitting device 300 in accordance with an embodiment of the present application includes forming the buffer layer 304 on the surface 302a of the base portion 302b and covering the protrusions 302c. The buffer layer 304 comprises aluminum nitride (AlN). The method of forming a buffer layer 304 includes physical vapor deposition (PVD). The method of fabricating the light-emitting device 300 further includes forming the first semiconductor layer 306, the light-emitting structure 308, and the second semiconductor layer 310 by epitaxial growth such as metal organic chemical vapor deposition (MOCVD). The method of pitaxial growth includes, but is not limited to, MOCVD, hydride vapor phase epitaxial (HVPE), or liquid-phase epitaxy (LPE).

As shown in FIG. 3A, the light-emitting device 300 includes a cap layer 340 between the buffer layer 304 and the first semiconductor layer 306. The cap layer 340 has a thickness T that is greater than the thickness of the buffer layer 304. The cap layer 340 comprises III-V compound semiconductor having an energy gap smaller than that of the material of the buffer layer 304. In an embodiment, the cap layer 340 comprises gallium nitride (GaN). Specifically, the cap layer 340 covers the buffer layer 304, and a portion of the cap layer 340 is located in the recess 311. The cap layer 340 includes a top surface 3401 opposite to the buffer layer 304, and the thickness T of the cap layer 340 refers to the shortest distance between the first portion 3042 of and the top surface 3401. In one embodiment, the cap layer 340 has a thickness T greater than 1 μm; in another embodiment, the thickness T of the cap layer 340 is not more than 3.5 μm; and still in another embodiment, the thickness T of the cap layer 340 is between 1 μm and 2 μm. In an embodiment, the cap layer 340 includes impurities that are not intentionally doped. Specifically, the impurity concentration of the cap layer 340 is not more than $5 \times 10^{17}/cm^3$, and in one embodiment, not more than $1 \times 10^{17}/cm^3$. In this embodiment, since the plurality of protrusions 302c is formed on the surface 302a of the substrate structure 302 and the height of the protrusions 302c is not more than 1.5 µm, the cap layer 340 of the light-emitting device 300 is thinner than that of the conventional light-emitting device, yet the light-emitting device 300 has substantially the same performance as the conventional light-emitting device. Therefore, the light-emitting device 300 in the embodiment has an advantage of being small in size.

Figure 4A:
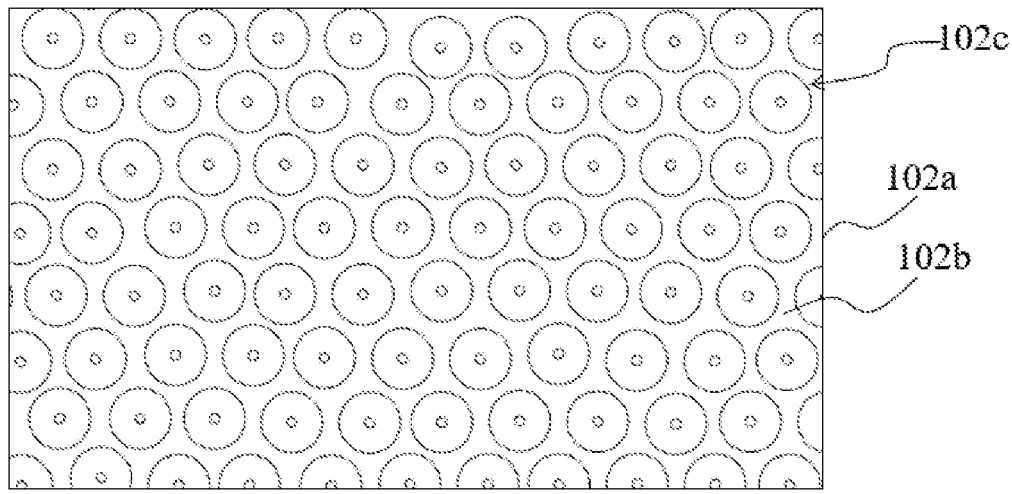
FIGS. 4A and 4B show top views of a substrate structure of the light-emitting device in accordance with different embodiments of the present application, respectively.
Figure 4B:
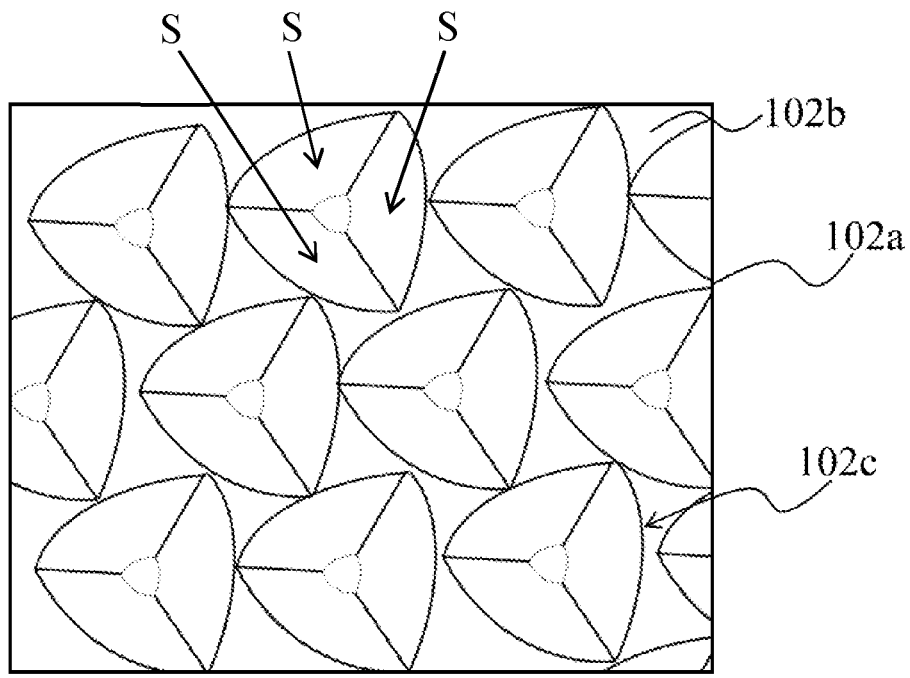

FIGS. 4A and 4B show top views of different embodiments of the substrate structure 102 of the light-emitting device in the present application. As shown in FIG. 4A, the surface 102a of the base portion 102b of the substrate structure 102 has a plurality of protrusions 102c having circular contours in the top view, and the plurality of protrusions 102c can be arranged in a hexagonal repeating pattern. As shown in FIG. 4B, a plurality of protrusions 102c are formed on the surface 102a of the base portion 102b of the substrate structure 102. Each protrusion 102c has a triangular contour in the top view, and one of the edges of each triangular contour can be a curve. The plurality of protrusions 102c can be arranged in a hexagonal repeating pattern.

Figure 5A:
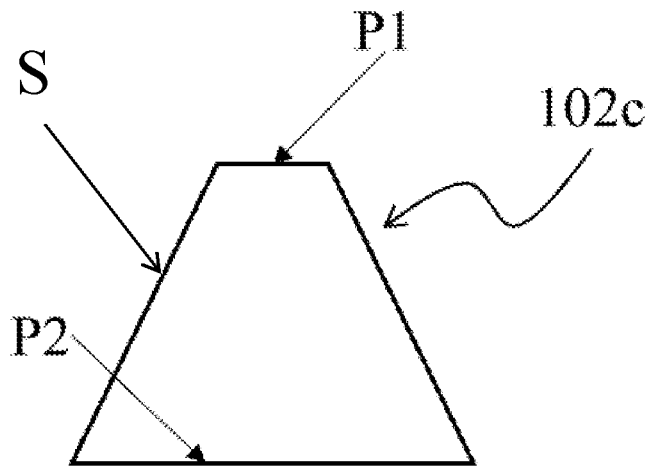
FIGS. 5A and 5B show cross-sectional views of a protrusion of the light-emitting device in accordance with different embodiments of the present application, respectively.
Figure 5B:
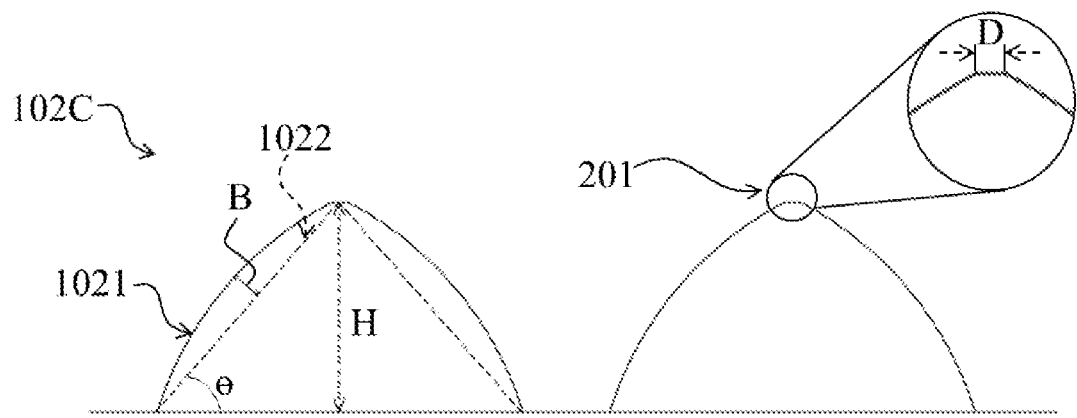

FIGS. 5A and 5B show cross-sectional views of different embodiments of the protrusion of the substrate structure of the light-emitting device in the present application. As shown in FIG. 5A, the protrusion 102c is substantially a trapezoid. Specifically, the protrusion 102c has an upper plane P1 and a lower plane P2 opposite to the upper plane P1, and the lower plane P2 is closer to the surface 102a of the base portion 102b than the upper plane P1. In one embodiment, the ratio of an area of the upper plane P1 to an area of the lower plane P2 is greater than zero and not more than 0.3. In one embodiment, as shown in FIG. 4B and FIG. 5A, the three-dimensional shape of the protrusion 102c is a truncated triangular pyramid. In the top view, the triangular contour of the lower plane P2 surrounds the triangular contour of the upper plane P1. Three inclined surface S are respectively formed between each edge of the triangle of P2 and each edge of the triangle of the upper plane P1. In the embodiment, the period P is defined as the shortest distance between the centers of the planes P1 of the two adjacent protrusions 102c.

As shown in FIG. 5B, the protrusion 102c includes an arc 1021 which protrudes outward, and two ends of the arc 1021 are connected to form a pseudo chord 1022. The protrusion 102c includes a top portion 201 connecting to the arc 1021. In the embodiment, the maximum distance B between the arc 1021 and the chord 1022 is greater than 0 µm, and in another embodiment, not greater than 0.5 µm. The width D of the top portion 201 of the protrusion 102c is the maximum distance between any two points on the peripheral of the top portion 201. In one embodiment, the width D of the top 201 is zero. In another embodiment, the width D of the top 201 is greater than zero. θ is an angle between the surface 102a and the chord 1022. In the present embodiment, the height H is greater than 0 µm and not more than 1.5 µm.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
a substrate structure, comprising a base portion having a surface and a plurality of protrusions regularly formed on the base portion;
a buffer layer covering the plurality of protrusions and the surface; and
III-V compound semiconductor layers formed on the buffer layer;
wherein one of the plurality of protrusions comprises a first portion and a second portion formed on the first portion and the first portion is integrated with the base portion;
wherein the base portion comprises a first material and the first portion comprises the first material,
wherein the first portion comprises a first side surface and the second portion comprises a second side surface connecting the first side surface; and
wherein the buffer layer is formed on and contacts the first side surface, the second side surface and the surface of the base portion.

2. The light-emitting device according to claim 1, wherein the second portion comprises a second material which is different from the first material and a refractive index of the second material is smaller than a refractive index of the first material.

3. The light-emitting device according to claim 1, wherein the first portion of one of the plurality of protrusions has a height H1 and the one of the plurality of protrusions has a height H; wherein a ratio of H1 to H is between 1% and 30% both inclusive.

4. The light-emitting device according to claim 2, wherein the buffer layer comprises a third material which is different from the second material.

5. The light-emitting device according to claim 4, wherein the buffer layer comprises aluminum nitride.

6. The light-emitting device according to claim 2, wherein the second material comprises $SiO_2$.

7. The light-emitting device according to claim 1, wherein the first material comprises sapphire and the surface is c-plane of the sapphire.

8. The light-emitting device according to claim 1, wherein the first portion comprises a planar top and the second portion is formed on and contacts the planar top.

9. The light-emitting device according to claim 1, wherein an arrangement of the plurality of protrusions has a period and the period is between 1 µm and 3 µm both inclusive.

10. The light-emitting device according to claim 1, wherein in a cross-sectional view, an included angle between a side surface of one of the plurality of protrusions and the surface of the base portion is less than 65 degrees.

11. The light-emitting device according to claim 1, wherein a thickness of the buffer layer is greater than 5 nm and not more than 50 nm.

12. The light-emitting device according to claim 1, wherein a three-dimensional shape of one of the plurality of protrusions comprises a dome, a cone or a pyramid.

13. The light-emitting device according to claim 1, wherein in a cross-sectional view, one of the plurality of protrusions comprises an arc which protrudes outward, and two ends of the arc are connected to form a pseudo chord; and
wherein a maximum distance between the arc and the pseudo chord is greater than 0 µm and not greater than 0.5 µm.

14. The light-emitting device according to claim 1, wherein the buffer layer is conformably formed on the first side surface, the second side surface and the surface of the base portion.

\* \* \* \* \*